United States Patent
Yonehara et al.

(10) Patent No.: US 10,600,900 B2
(45) Date of Patent: Mar. 24, 2020

(54) SEMICONDUCTOR DEVICE AND ELECTRIC APPARATUS

(71) Applicant: Kabushiki Kaisha Toshiba, Minato-ku (JP)

(72) Inventors: Toshiya Yonehara, Kawasaki (JP); Tatsuo Shimizu, Shinagawa (JP); Hiroshi Ono, Setagaya (JP); Daimotsu Kato, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/118,603

(22) Filed: Aug. 31, 2018

(65) Prior Publication Data

US 2019/0115461 A1 Apr. 18, 2019

(30) Foreign Application Priority Data

Oct. 16, 2017 (JP) .................................. 2017-200530

(51) Int. Cl.
*H01L 29/778* (2006.01)
*H01L 29/49* (2006.01)
(Continued)

(52) U.S. Cl.
CPC ........ *H01L 29/778* (2013.01); *H01L 23/5329* (2013.01); *H01L 29/0649* (2013.01);
(Continued)

(58) Field of Classification Search
None
See application file for complete search history.

(56) References Cited

U.S. PATENT DOCUMENTS

| 7,807,990 B2 | 10/2010 | Koyama et al. |
| 9,018,709 B2 | 4/2015 | Takeoka |

(Continued)

FOREIGN PATENT DOCUMENTS

| JP | 2007-329237 | 12/2007 |
| JP | 2012-64695 | 3/2012 |

OTHER PUBLICATIONS

Kamata, H. et al. "Design of $Al_2O_3/SiO_2$ laminated stacks with multiple interface dipole layers to achieve large flatland voltage shifts of MOS capacitors", Applied Physics Letters 110, 2017, 5 pages.

*Primary Examiner* — Andres Munoz
(74) *Attorney, Agent, or Firm* — Oblon, McClelland, Maier & Neustadt, L.L.P.

(57) ABSTRACT

In one embodiment, a semiconductor device is provided with a semiconductor layer made of a nitride semiconductor, a first gate electrode, a first structure body between the first gate electrode and the semiconductor layer, and a first insulating layer between the semiconductor layer and the first structure body. The first structure body has a first intermediate layer made of a conductor to suppress generation of charges at respective interfaces with adjacent layers, a first layer having dielectric property between the first gate electrode and the first intermediate layer, and a second layer having dielectric property between the first gate electrode and the first layer, and has dipoles at an interface between the first layer and the second layer.

23 Claims, 11 Drawing Sheets

(51) Int. Cl.
  *H01L 29/06* (2006.01)
  *H01L 29/423* (2006.01)
  *H01L 23/532* (2006.01)
  *H01L 29/417* (2006.01)
  *H01L 29/78* (2006.01)
  *H01L 29/51* (2006.01)
  *H01L 29/66* (2006.01)
  *H01L 21/28* (2006.01)
  *H01L 29/20* (2006.01)

(52) U.S. Cl.
  CPC .. *H01L 29/40111* (2019.08); *H01L 29/41725* (2013.01); *H01L 29/4232* (2013.01); *H01L 29/42352* (2013.01); *H01L 29/4966* (2013.01); *H01L 29/516* (2013.01); *H01L 29/6684* (2013.01); *H01L 29/7786* (2013.01); *H01L 29/78391* (2014.09); *H01L 29/2003* (2013.01); *H01L 29/4236* (2013.01); *H01L 29/4238* (2013.01); *H01L 29/42336* (2013.01); *H01L 29/513* (2013.01)

(56) References Cited

U.S. PATENT DOCUMENTS

| | | | |
|---|---|---|---|
| 9,704,961 B2 * | 7/2017 | Jang | H01L 29/4236 |
| 2015/0325447 A1 * | 11/2015 | Ogawa | H01L 21/28088 |
| | | | 438/680 |
| 2016/0012896 A1 * | 1/2016 | Li | G11C 16/10 |
| | | | 365/185.18 |

* cited by examiner

US 10,600,900 B2

SEMICONDUCTOR DEVICE AND ELECTRIC APPARATUS

CROSS-REFERENCE TO RELATED APPLICATION

This application is based upon and claims the benefit of priority from the prior Japanese Patent Application No. 2017-200530, filed on Oct. 16, 2017, the entire contents of which are incorporated herein by reference.

FIELD

Embodiments described herein relate generally to a semiconductor device and an electric apparatus.

BACKGROUND

In a transistor using a nitride semiconductor, high withstand characteristics are obtained, due to electrical material characteristics of the nitride semiconductor that is a material with a wide band gap, and such a transistor becomes a semiconductor device that replaces a power device using silicon.

In addition, since the nitride semiconductor has a high electron mobility, the transistor can electrically perform a high speed response, and when the transistor is used as a high speed switching device, a high energy conversion efficiency is obtained.

The transistor using the nitride semiconductor like this has a high breakdown voltage and high speed responsiveness, and thereby it is expected that the transistor like this is used for a power conversion device such as a power source. Particularly, since a MOS type field effect transistor (MOSFET) having a gate structure made of a metal, an oxide (or an insulator), and a semiconductor can apply a sufficient voltage to a gate electrode, the MOSFET is a transistor structure advantageous in increasing speed.

However, the MOS type field effect transistor (MOSFET) using a nitride semiconductor has a low threshold voltage, and it is difficult to control the threshold voltage thereof to an arbitrary value. Accordingly, improvement of controllability relating to the threshold voltage of the MOSFET using a nitride semiconductor is desired.

DETAILED DESCRIPTION

Figure 1A:
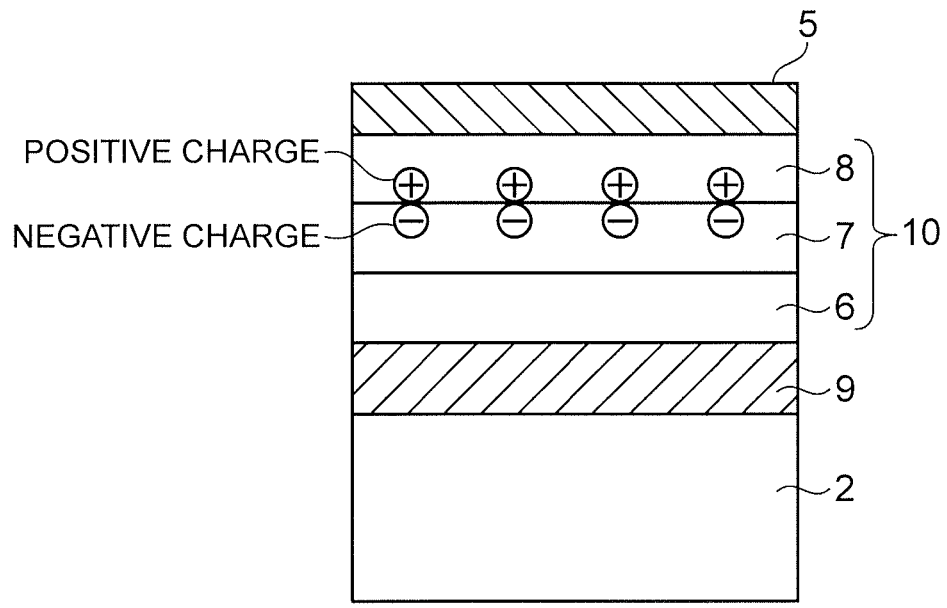
FIG. 1A-FIG. 1B are each a schematic sectional view of a semiconductor device of a first embodiment.

According to one embodiment, a semiconductor device is provided with a semiconductor layer made of a nitride semiconductor, a first gate electrode, a first structure body between the first gate electrode and the semiconductor layer, and a first insulating layer between the semiconductor layer and the first structure body. The first structure body has a first intermediate layer made of a conductor to suppress generation of charges at respective interfaces with adjacent layers, a first layer having dielectric property between the first gate electrode and the first intermediate layer, and a second layer having dielectric property between the first gate electrode and the first layer, and has dipoles at an interface between the first layer and the second layer.

Hereinafter, embodiments of the present invention will be described with reference to the drawings. Ones with the same symbols show the similar ones. In addition, the drawings are schematic or conceptual, and accordingly, the relation between a thickness and a width of each portion, and a ratio coefficient of sizes between portions are not necessarily identical to those of the actual ones. In addition, even when the same portions are shown, the dimensions and the ratio coefficient thereof may be shown different depending on the drawings.

In the present specification, in order to indicate the position relation of components and so on, an upward direction in the drawing is stated as "up or upward", and a downward direction in the drawing is stated as "down or downward". In the present specification, the concepts of "up or upward" and "down or downward" are not necessarily terms indicating the relation with the direction of the gravity.

In the present specification, "a GaN based semiconductor" is a general term of a semiconductor containing gallium nitride (GaN), aluminum nitride (AlN), indium nitride (InN), and an intermediate composition thereof.

(First embodiment) FIG. 1A shows a conceptual diagram for describing a semiconductor device 100 of the present embodiment.

The semiconductor device 100 is a field effect transistor (Field Effect Transistor: FET) composed of a GaN based semiconductor.

FIG. 1A shows a gate portion of the semiconductor device 100. The gate portion has a structure in which a first insulating layer 9, a first structure body 10, and a gate electrode (a first gate electrode) 5 are laminated on a semiconductor layer (a second semiconductor layer) 2 in this order. The first structure body 10 includes an intermediate layer (a first intermediate layer) 6, a first layer 7, and a second layer 8.

The first layer 7 and the second layer 8 which are included in the first structure body 10 are each a dielectric body having dielectric property. The first layer 7 and the second layer 8 which are each made of the dielectric body are polarized into a negatively charged portion and a positively charged portion at the interface between the first layer 7 and the second layer 8. For example, the first layer 7 is made of silicon oxide ($SiO_2$), and the second layer 8 is made of hafnium oxide ($HfO_2$). In this case, negative charges are generated in the first layer 7 and positive charges are generated in the second layer 8 at the interface between the first layer 7 and the second layer 8, by the movement of oxygen atoms between the first layer 7 and the second layer 8, for example. By this means, interface dipoles are generated, and a potential is generated between the first layer 7 and the second layer 8 by the interface dipoles. At this time, it is possible to improve a threshold voltage of the semiconductor device 100 by the potential generated when the negative charges are generated in the first layer 7 and the positive charges are generated in the second layer 8. On the other hand, a threshold voltage of the semiconductor device 100 might be decreased, by a potential generated when positive charges are generated in the first layer 7 and negative charges are generated in the second layer 8.

For the reason, in order to improve the threshold voltage of the semiconductor device 100, materials for the layers 7, 8 are selected so that negative charges are generated in the first layer 7 and positive charges are generated in the second layer 8 at the interface between the first layer 7 and the second layer 8.

Furthermore, in order to control the threshold voltage of the semiconductor device 100, a second structure body 10*a* having a structure similar to the first structure body 10 can be further laminated on the first structure body 10.

As the first structure body 10, the laminated body of the intermediate layer 6, the first layer 7 and the second layer 8 has been shown, but the first structure body 10 may be further provided with an insulating layer. In this case, the insulating layer is provided on the second layer 8. For example, at the interface between the second layer 8 and the insulating layer, negative charges are generated in the second layer 8 side and positive charges are generated in the insulating layer side, and thereby it is possible to make the potential to be generated in the first structure body 10 further larger.

As shown in FIG. 1A, when the first structure body 10 is provided on the first insulating layer 9 on the semiconductor layer 2, the intermediate layer 6 is provided between the first insulating layer 9 and the first layer 7.

The intermediate layer 6 is made of a conductor, for example. When the intermediate layer 6 is made of a conductor, the intermediate layer 6 is made of amorphous silicon, polysilicon (p-type polysilicon), or a metal having a high work function such as gold (Au), platinum (Pt), tungsten (W), or the like, for example. The intermediate layer 6 is made of a conductor, and thereby the intermediate layer 6 suppresses generation of interface dipoles, namely, positive charges and negative charges between the intermediate layer 6 and each of the adjacent layers. The intermediate layer 6 is provided, and thereby the desired first layer 7 can be applied on the intermediate layer 6 regardless of the material of the lower layer of the intermediate layer 6.

Figure 1B:
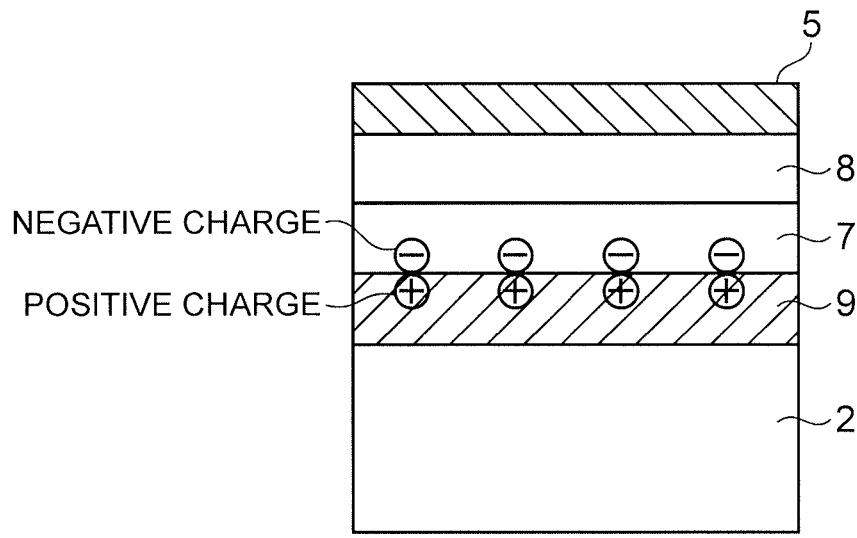

When the intermediate layer 6 made of a conductor is not provided, positive charges are generated in the first insulating layer 9, and negative charges are generated in the first layer 7, depending on the material of the first insulating layer 9, as shown in FIG. 1B, and thereby there is a possibility that a potential to decrease the threshold voltage might be generated.

Figure 2A:
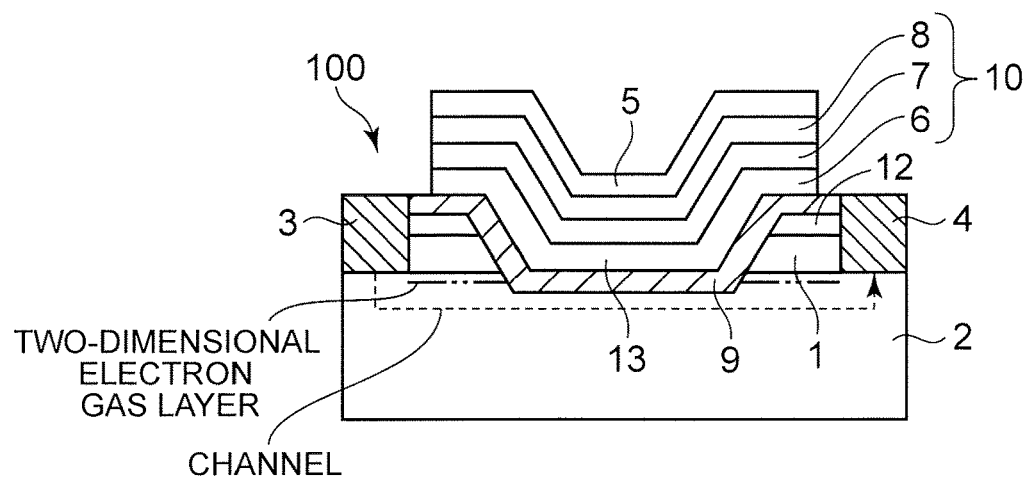
FIG. 2A-FIG. 2C are each a schematic sectional view of the semiconductor device of the first embodiment.

A structure of the semiconductor device 100 will be further described using FIG. 2A. FIG. 2A shows a schematic sectional view of the semiconductor device 100.

The semiconductor device 100 is provided with a first semiconductor layer 1, the second semiconductor layer 2, a source electrode 3, a drain electrode 4, the gate electrode 5, the first insulating layer 9, the first structure body 10, and a second insulating layer 12. The first structure body 10 includes the intermediate layer 6, the first layer 7, and the second layer 8.

In the semiconductor device 100, the first structure body 10 and the gate electrode 5 are laminated on the second semiconductor layer 2 between the source electrode 3 and the drain electrode 4 which are provided on the second semiconductor layer 2, via the first insulating layer 9.

The first semiconductor layer 1 is made of aluminum gallium nitride ($Al_xGa_{(1-x)}N$, $0<x\leq1$), for example. Hereinafter, aluminum gallium nitride is written as AlGaN. A thickness of the first semiconductor layer 1 is not less than 1 nm and not more than 100 nm, for example.

The second semiconductor layer 2 is in contact with the first semiconductor layer 1. The second semiconductor layer 2 is made of gallium nitride (GaN), for example. The second semiconductor layer is preferably made of i-GaN which is not intentionally doped with impurities. An impurity concentration of i-GaN is not more than $10^{17}$ cm$^{-3}$, for example. A thickness of the second semiconductor layer 2 is not less than 10 nm and not more than 10 μm, for example. The first semiconductor layer 1 is made of a material having a larger band gap than the second semiconductor layer 2.

The source electrode 3 and the drain electrode 4 are provided on the second semiconductor 2 at the first semiconductor 1 side. The source electrode 3 and the drain electrode 4 are electrically in contact with the second semiconductor layer 2. The source electrode 3 and the drain electrode 4 are each a metal electrode, for example. The metal electrode has a laminated structure of titanium (Ti), aluminum (Al), nickel (ni), and gold (Au), or a mixture thereof.

The gate electrode 5 is provided above the first semiconductor layer 1 at a side opposite to the second semiconductor layer 2 side. The gate electrode 5 is provided between the source electrode 3 and the drain electrode 4. The gate electrode 5 is a metal electrode, for example, and is made of titanium nitride (TiN), for example.

The first insulating layer 9 is provided between the first semiconductor layer 1 and the gate electrode 5. The first insulating layer 9 exists between the intermediate layer 6 described later and the second insulating layer 12, between the intermediate layer 6 and the first semiconductor layer 1, and between the intermediate layer 6 and the second semiconductor layer 2, respectively.

The first insulating layer 9 is made of silicon oxide, silicon nitride, silicon oxynitride, gallium oxide, aluminum oxide, aluminum oxynitride, hafnium oxide, or the like, for example. The first insulating layer 9 may be a laminated body of these insulating layers. A thickness of the first insulating layer 9 is thicker than a thickness of the first structure body 10 described later. A thickness of the first insulating layer 9 is not less than 10 nm and not more than 100 nm, for example. The second insulating layer 12 exists between the first semiconductor layer 1 and the first insulating layer 9. The second insulating layer 12 is made of silicon nitride (SiN), for example. The second insulating layer 12 may be dispensable.

The first structure body 10 is between the gate electrode 5 and the first insulating layer 9. The first structure body 10 includes the intermediate layer 6, the first layer 7, and the second layer 8. A total thickness of the first structure body 10 is not less than 3 nm and not more than 30 nm, for example.

The first layer 7 is between the gate electrode 5 and the intermediate layer 6. The second layer 8 is between the gate electrode 5 and the first layer 7. The first layer 7 and the second layer 8 are each made of a dielectric body having dielectric property. Each of the first layer 7 and the second layer 8 made of a dielectric body has a wide band gap, and thereby is also an insulator. When a voltage is applied between the first layer 7 and the second layer 8, these layers are polarized into a negatively charged portion and a positively charged portion inside the respective layers 7, 8.

In order that negative charges are generated in the first layer 7 and positive charges are generated in the second layer 8 at the interface between the first layer 7 and the second layer 8, to generate a potential between the first layer 7 and the second layer 8, specific materials are combined as a material of the first layer 7 and a material of the second layer 8.

For example, when the first layer 7 is made of silicon dioxide ($SiO_2$), the second layer 8 is made of hafnium oxide ($HfO_2$), aluminum oxide ($Al_2O_3$), or titanium oxide ($TiO_2$).

For example, when the first layer 7 is made of any of lanthanum oxide ($La_2O_3$), magnesium oxide (MgO), and strontium oxide (SrO), the second layer 8 is made of silicon dioxide ($SiO_2$).

For example, when the first layer 7 is made of copper (ii) phthalocyanine (CuPc) or 3,4,9,10-perylenetetracarboxylic acid dianhydride (PTCDA), the second layer 8 is made of Bathocuproine (BCP) or 3,4,9,10-perylenetetracarboxylic acid bisbenzoimidazole (PTCBI). In addition, the first layer 7 and the second layer 8 may be made of the same material, and in this case, $HfO_2$ exhibiting ferroelectric property is selected as the materials for the first layer 7 and the second layer 8, for example.

For example, when the first layer 7 is made of silicon dioxide ($SiO_2$), and the second layer 8 is made of hafnium oxide ($HfO_2$), a potential generated in the first structure body 10 is about 0.2-0.3 V, for example. For the reason, the threshold voltage of the semiconductor device 100 provided with the first structure body 10 is improved by about 0.2-0.3 V.

A thickness of the first layer 7 is not less than 1 nm and not more than 10 nm, for example. A thickness of the second layer 8 is not less than 1 nm and not more than 5 nm, for example The intermediate layer 6 is between the first layer 7 and the first insulating layer 9. The intermediate layer 6 is electrically connected to the first gate electrode 5. A material is used for the intermediate layer 6 so that charges are not generated at the respective interfaces with the first layer 7 and the first insulating layer 9 which are adjacent to the intermediate layer 6.

A material of the intermediate layer 6 is a conductor. The intermediate layer 6 is made of amorphous silicon (a-Si), polysilicon (p-type polysilicon), gold (Au), platinum (Pt), tungsten (W), or the like, for example. The intermediate layer 6 is preferably a conductor having a work function of not less than 4.8 eV.

The intermediate layer 6 may be a laminated body of different conductors. However, the layers of the intermediate layer 6 which are respectively in contact with the first insulating layer 9 and the first layer 7 are each made of amorphous silicon (a-Si), polysilicon (p-type polysilicon), gold (Au), platinum (Pt), tungsten (W), or the like. A highly conductive material such as aluminum (Al) can be used as the material of the layers of the intermediate layer 6 which are not in contact with the first insulating layer 9 and the first layer 7.

A thickness of the intermediate layer 6 is preferably not less than 1 nm and not more than 10 nm, for example.

Hereinafter, an operation of the semiconductor device 100 of FIG. 2A will be described.

As shown in FIG. 2A, a two-dimensional electron gas layer is formed in the second semiconductor layer 2 in the vicinity of the interface between the first semiconductor layer 1 and the second semiconductor layer 2. A dashed-two dotted line of FIG. 2A indicates a position where the two-dimensional electron gas layer exists.

In an OFF state in which a voltage not exceeding the threshold voltage is applied to the gate electrode 5, a channel does not exist in the second semiconductor layer 2 in which a concave portion 13 is provided. For the reason, in the case of a state in which a voltage is not applied to the gate electrode 5, a current does not flow between the source electrode 3 and the drain electrode 4.

Since the second semiconductor layer 2 is made of i-GaN which is not intentionally doped with impurities, the second semiconductor layer 2 exhibits n-type conductivity of a low impurity concentration.

In the case of an ON state in which a positive voltage exceeding the threshold voltage is applied to the gate electrode 5, since the intermediate layer 6 is electrically connected to the gate electrode 5, a surface potential of the second semiconductor 2 at the intermediate layer 6 side is decreased, and thereby the second semiconductor layer 2 becomes an accumulation state of electrons. For the reason, as shown in a dotted line of FIG. 2A, electrons flow from the source electrode 3 to the drain electrode in the direction of an arrow, and thereby the semiconductor device 100 becomes an ON state. A flow rate of the electrons varies depending on a voltage to be applied to the first gate electrode 5. Accordingly, the semiconductor device 100 operates as an FET.

As shown in FIG. 2A, the semiconductor device 100 has the first structure body 10 to be electrically connected to the gate electrode 5. Since negative charges are generated in the first layer 7 and positive charges are generated in the second layer 8, at the interface between the first layer 7 and the second layer 8 which are included in the first structure body 10, a potential is generated between the first layer 7 and the second layer 8. It is possible to improve the threshold voltage of the semiconductor device 100 by the potential generated by these charges.

On the other hand, the intermediate layer 6 made of a conductor exists between the first layer 7 of the first structure body 10 and the first insulating layer 9, and thereby the intermediate layer 6 suppresses that charges are generated at the respective interfaces with the first layer 7 and the first insulating layer 9 which are adjacent to the intermediate layer 6. Accordingly, the material of the first layer 7 and the material of the second layer 8 can be arbitrarily combined so that the threshold voltage of the semiconductor device 100 is improved regardless of whatever material the material of the first insulating layer 9 is. Further, it is preferable that in the semiconductor device 100, a thickness of the first insulating layer 9 is made thicker than the first structure body 10, and a material of the first insulating layer 9 is made to be a material having a larger band gap than the second semiconductor layer 2, for example. By this means, since a large energy barrier difference is generated between the first insulating layer 9 and the second semiconductor layer 2, it is possible to prevent that electrons and holes leak out from the channel formed in the second semiconductor layer 2 toward the first gate electrode 5. Accordingly, it is possible to suppress that the threshold voltage of the semiconductor device 100 temporally varies by the electrons and the holes which have leaked out from the channel.

In addition, it is possible to provide a second structure body having a structure similar to the first structure body 10 between the first gate electrode 5 and the first structure body 10, in the semiconductor device 100. In this case, the second structure body has a second intermediate layer which is made of a conductor and suppresses generation of charges at respective interfaces with the adjacent layers, a third layer having dielectric property between the first gate electrode and the second intermediate layer, and a fourth layer having dielectric property which is between the first gate electrode and the third layer, and has charges at a portion with the third layer. It is possible to further improve the threshold voltage of the semiconductor device 100 by providing a plurality of the structure bodies. For the reason, it is possible to control the threshold voltage of the semiconductor device 100 to an arbitrary value easily, compared with a conventional MOS-FET.

In addition, though not shown in the drawings, in order to make the semiconductor device 100 have a desired threshold voltage, it is possible to further laminate a plurality of the structure bodies between the gate electrode 5 and the first structure body 10. For example, when the threshold voltage of the semiconductor device 100 is about 0.5 V, in order to improve the threshold voltage of the semiconductor device 100 to about 1.5 V, the second structure body is further provided on the first structure body 10. In this case, each of the first structure body 10 and the second structure body improves the threshold voltage by 0.5 V. A sum of thicknesses of the two structure bodies is not less than 6 nm and not more than 50 nm. Accordingly, in order to make the semiconductor device 100 have a desired threshold voltage, the number of the structure bodies is determined and the determined number of the structure bodies are provided.

In addition, In FIG. 2A, the first semiconductor layer 1 is not necessarily required. In addition, the first insulating layer 9 is not necessarily required.

As described above, the semiconductor device 100 of the present embodiment has the first structure body 100, and thereby a potential is generated by the charges at the interface between the first layer 7 and the second layer 8, and it is possible to control the threshold voltage to a desired value.

A modified structure of the semiconductor device 100 of FIG. 2A is shown below.

Figure 2B:
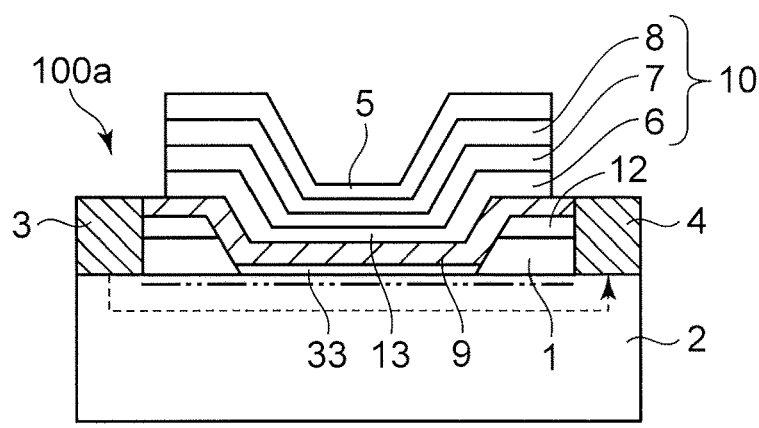

In a structure of a semiconductor device 100*a* shown in FIG. 2B, the concave portion 13 of the intermediate layer 6 is not provided in the second semiconductor layer 2, but the concave portion 13 of the intermediate layer 6 is provided in the first semiconductor layer 1. The semiconductor device 100*a* has a mobility higher than the semiconductor device 100, but has a threshold voltage lower than the semiconductor device 100. For the reason, when it is desired to improve a threshold voltage of the semiconductor device 100*a*, the first structure body 10, furthermore, a plurality of the structure bodies are provided, and thereby it is possible to improve the threshold voltage of the semiconductor device 100*a*. In addition, the semiconductor device 100*a* has a third semiconductor layer 33 between the second semiconductor layer 2 and the first insulating layer 9. The third semiconductor layer 33 is made of aluminum nitride (AlN) or AlGaN.

Figure 2C:
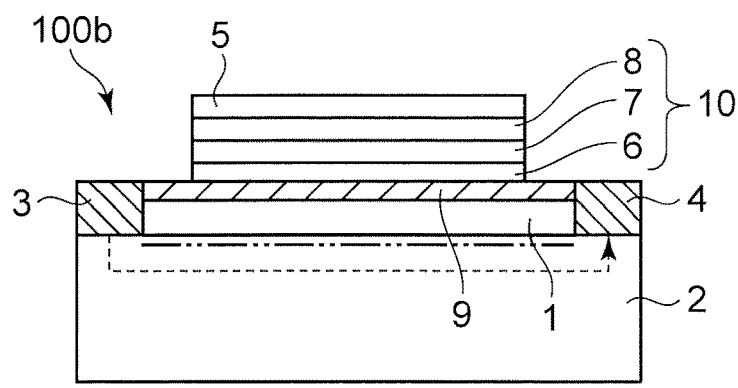

In a structure of a semiconductor device 100*b* shown in FIG. 2C, the concave portion 13 is not provided in the intermediate layer 6. The semiconductor device 100*b* has a mobility higher than the semiconductor devices 100, 100*a*, but has a threshold voltage lower than the semiconductor devices 100, 100*a*. For the reason, when it is desired to improve a threshold voltage of the semiconductor device 100*b*, the first structure body 10, furthermore, a plurality of the structure bodies are provided, and thereby it is possible to improve the threshold voltage of the semiconductor device 100*b*.

(Second embodiment) A semiconductor device 101 will be described using FIGS. 3-5.

The same symbols are given to the same portions as FIGS. 2A-2C, and the description thereof will be omitted.

Figure 3:
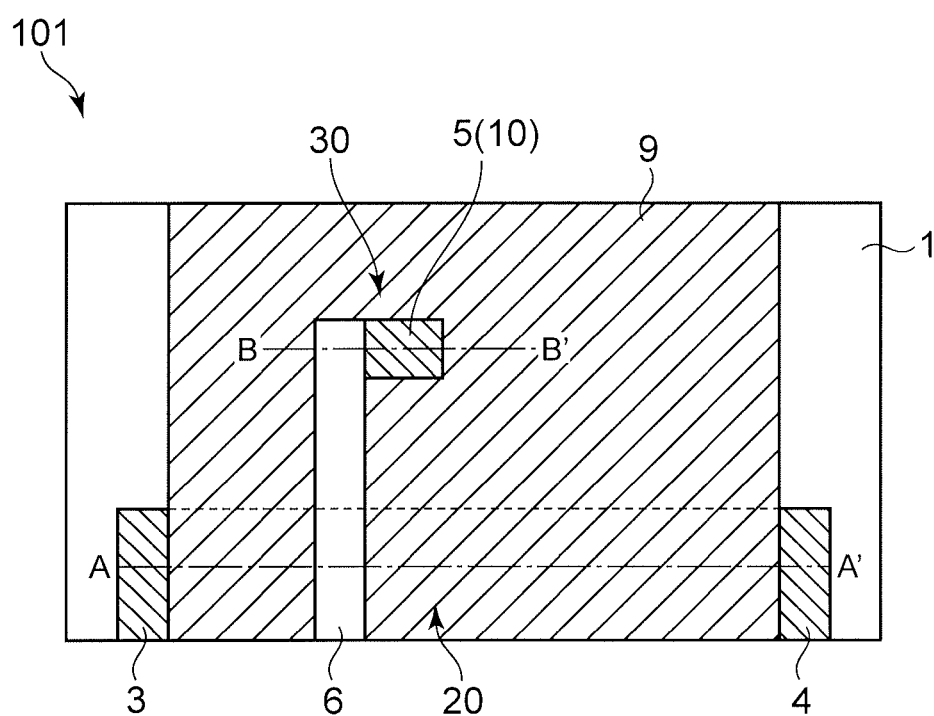
FIG. 3 is a top view of a semiconductor device of a second embodiment.

FIG. 3 is a top view of the semiconductor device 101. The semiconductor device 101 of the present embodiment is different in structure from the semiconductor device 100 of the first embodiment in a following point. That is, in the semiconductor device 101, the first gate electrode 5 and the first structure body 10 are not arranged in a region (hereinafter, is made to be "a first region 20") between the source electrode 3 and the drain electrode 4, but are arranged in another region (hereinafter, is made to be "a second region 30") of the upper surface of the semiconductor device 101 different from the first region 20. And the intermediate layer 6 is formed across the first region 20 and the second region 30 to connect the both regions 20, 30.

Hereinafter, the semiconductor device 101 will be described in detail. The semiconductor device 101 is a field effect transistor (Field Effect Transistor: FET) composed of a GaN based semiconductor.

The semiconductor device 101 is provided with the first semiconductor layer 1, the second semiconductor layer 2, the source electrode 3, the drain electrode 4, the first gate electrode 5, the first insulating layer 9, and the first structure body 10. In addition, the semiconductor device 101 has the first region 20 and the second region 30 on the upper surface of the semiconductor device 101.

The first region 20 is on the upper surface of the semiconductor device 101, and is a region surrounded by a dotted line between the source electrode 3 and the drain electrode 4. The second region 30 is on the upper surface of the semiconductor device 101, and is a region distant from the first region 20 between the source electrode 3 and the drain electrode 4. The first gate electrode 5 is in the second region 30, and accordingly it is not provided between the source electrode 3 and the drain electrode 4.

The intermediate layer 6 has one portion and the other portion, and the both portions are on the first insulating layer 9 on the upper surface of the semiconductor device 101. The one portion of the intermediate layer 6 is in the second region 30, and is between the first gate electrode 5 and the first insulating layer 9.

The other portion of the intermediate layer 6 is in the first region 20, and is on the upper surface of the first insulating layer 9.

The one portion of the intermediate layer 6 and the other portion of the intermediate layer 6 are electrically connected, and the second semiconductor layer 2 in the first region 20 and the first gate electrode 5 in the second region 30 are also electrically connected.

Figure 4A:
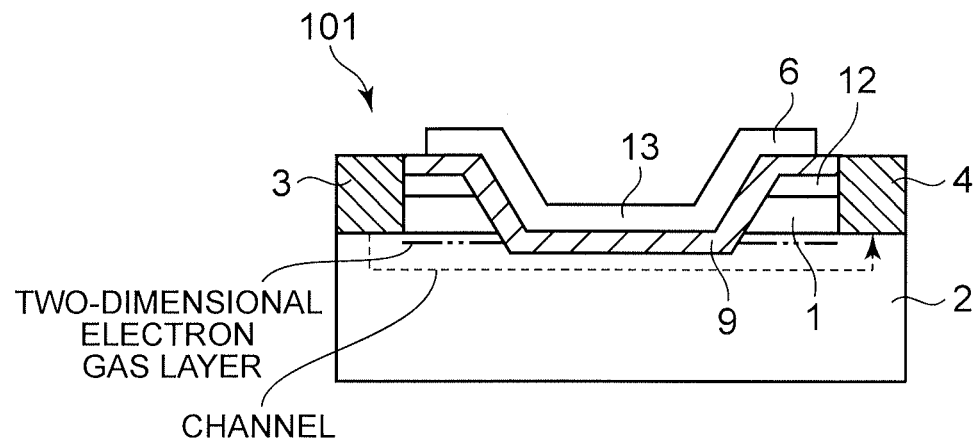
FIG. 4A-FIG. 4C are each a schematic sectional view of the semiconductor device of the second embodiment.

FIG. 4A is a schematic sectional view of the semiconductor device 101 shown in FIG. 3 taken along a line A-A'.

The same symbols are given to the same portions as FIGS. 2A-2C, and the description thereof will be omitted.

The semiconductor device 101 of FIG. 4A is not provided with the first structure body 10 between the source electrode 3 and the drain electrode 4.

In FIG. 4A, the semiconductor device 101 is provided with the first semiconductor layer 1, the second semiconductor layer 2, the source electrode 3, the drain electrode 4, the intermediate layer 6, the first insulating layer 9, and the second insulating layer 12.

The intermediate layer 6 of FIG. 4A is the other portion of the intermediate layer 6. The intermediate layer 6 is at the first semiconductor layer 1 at a side opposite to the second semiconductor layer 2 side. The intermediate layer 6 is between the source electrode 3 and the drain electrode 4. The intermediate layer 6 has the concave portion 13. As shown in FIG. 4A, the concave portion 13 of the intermediate layer 6 is provided in the second semiconductor layer 2.

A modified structure of the semiconductor device 101 of FIG. 4A is shown below.

Figure 4B:
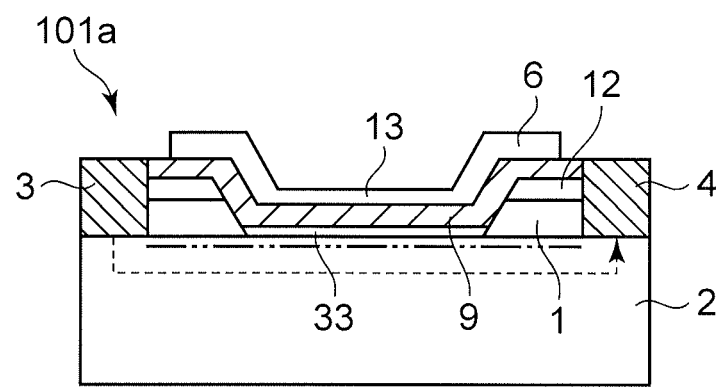

In a structure of a semiconductor device 101a shown in FIG. 4B, the concave portion 13 of the intermediate layer 6 is not provided in the second semiconductor layer 2, but the concave portion 13 of the intermediate layer 6 is provided in the first semiconductor layer 1. The semiconductor device 101a has a channel mobility in the concave portion 13 higher than the semiconductor device 101, but has a threshold voltage lower than the semiconductor device 101. For the reason, when it is desired to improve a threshold voltage of the semiconductor device 101a, the first structure body 10, furthermore, a plurality of the structure bodies are provided in the second region 30 described later, and thereby it is possible to improve the threshold voltage of the semiconductor device 101a.

Figure 4C:
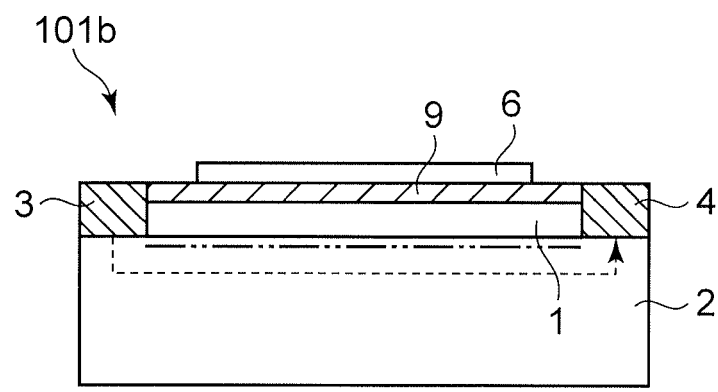

In addition, in a structure of a semiconductor device 101b shown in FIG. 4C, the concave portion 13 is not provided in the intermediate layer 6. The semiconductor device 101b has a channel mobility in the concave portion 13 higher than the semiconductor devices 101, 101a, but has a threshold voltage lower than the semiconductor devices 101, 101a. For the reason, when it is desired to improve a threshold voltage of the semiconductor device 101b, the first structure body 10, furthermore, a plurality of the structure bodies are provided in the second region 30 described later, and thereby it is possible to improve the threshold voltage of the semiconductor device 101b.

Figure 5:
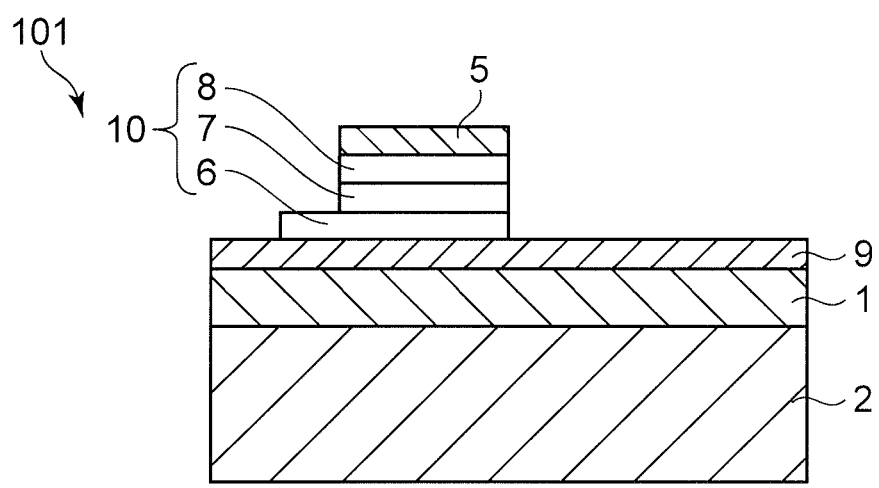
FIG. 5 is a schematic sectional view of the semiconductor device of the second embodiment.

FIG. 5 is a schematic sectional view of the semiconductor device 101 shown in FIG. 3 taken along a line B-B'. In FIG. 5, the semiconductor device 101 is provided with the first semiconductor layer 1, the second semiconductor layer 2, the first gate electrode 5, the first insulating layer 9, and the first structure body 10. The first structure body 10 includes the intermediate layer 6, the first layer 7, and the second layer 8.

The intermediate layer 6 of FIG. 5 is the one portion of the intermediate layer 6. The intermediate layer 6 is between the first layer 7 and the first insulating layer 9.

The intermediate layer 6 is provided across the first region and the second region 30, and in order to improve the conduction of carriers between the one portion and the other portion of the intermediate layer 6, the material of the intermediate layer 6 of the semiconductor device 101 is a conductor. The intermediate layer 6 is made of amorphous silicon (a-Si), polysilicon (p-type polysilicon), gold (Au), platinum (Pt), tungsten (W), or the like, for example. The intermediate layer 6 is made of a conductor having a high work function.

The intermediate layer 6 is electrically connected to the first gate electrode 5. The intermediate layer 6 does not generate charges at the respective interfaces with the first layer 7 and the first insulating layer 9 which are adjacent to the intermediate layer 6.

An operation of the semiconductor device 101 will be described using FIG. 4A and FIG. 5.

As shown in FIG. 4A, a two-dimensional electron gas layer is formed in the second semiconductor layer 2, in the vicinity of the interface between the first semiconductor layer 1 and the second semiconductor layer 2. A dashed-two dotted line of FIG. 4A indicates a position where the two-dimensional electron gas layer exists.

In an OFF state, a channel is not formed in the second semiconductor layer 2 in which the concave portion 13 is provided, and the semiconductor device 101 is in a state in which a current is difficult to flow. For the reason, in the case of a state in which a voltage is not applied to the first gate electrode 5, and a voltage is not also applied to the intermediate layer 6, a current does not flow between the source electrode 3 and the drain electrode 4.

Since the second semiconductor layer 2 is made of i-GaN which is not intentionally doped with impurities, the second semiconductor layer 2 exhibits n-type conductivity of a low impurity concentration.

When a positive voltage is applied to the first gate electrode 5, since the intermediate layer 6 is electrically connected to the first gate electrode 5, in FIG. 4A, a surface potential of the second semiconductor 2 at the intermediate layer 6 side is decreased, and thereby the second semiconductor layer 2 becomes an accumulation state of electrons. For the reason, as shown in a dotted line of FIG. 4A, electrons flow from the source electrode 3 to the drain electrode 4 in the direction of an arrow, and thereby the semiconductor device 101 becomes an ON state. A flow rate of the electrons varies depending on a voltage to be applied to the first gate electrode 5. Accordingly, the semiconductor device 101 operates as an FET.

As shown in FIG. 4A and FIG. 5, the first gate electrode 5 and the first structure body 10 may not be arranged in the first region 20 between the source electrode 3 and the drain electrode 4. In this case, the first gate electrode 5 and the first structure body 10 may be arranged in an arbitrary second region on the upper surface of the semiconductor device 101 which is distant from the first region 20.

As shown in FIG. 5, the semiconductor device 101 has the first structure body 10 to be electrically connected to the first gate electrode 5. At the interface between the first layer 7 and the second layer 8 which are included in the first structure body 10, since negative charges are generated in the first layer 7 and positive charges are generated in the second layer 8, a potential is generated between the first layer 7 and the second layer 8. It is possible to improve the threshold voltage of the semiconductor device 101 by the potential generated by these charges.

In addition, as shown in FIG. 5, the intermediate layer 6 exists between the first layer 7 of the first structure body 10 and the first insulating layer 9, and thereby the intermediate layer 6 suppresses that charges are generated at the respective interfaces with the first layer 7 and the first insulating layer 9 which are adjacent to the intermediate layer 6. Accordingly, the material of the first layer 7 and the material of the second layer 8 can be arbitrarily combined so that the threshold voltage of the semiconductor device 101 is improved regardless of the material of the first insulating layer 9.

Further, it is preferable that in the semiconductor device 101, a thickness of the first insulating layer 9 is made thicker than the first structure body 10, and a material of the first insulating layer 9 is made to be a material having a larger band gap than the second semiconductor layer 2, for example. By this means, since a large energy barrier difference is generated between the first insulating layer 9 and the second semiconductor layer 2, it is possible to prevent that electrons and holes leak out from the channel formed in the second semiconductor layer 2 toward the first gate electrode 5. Accordingly, it is possible to suppress that the threshold voltage of the semiconductor device 101 temporally varies by the electrons and the holes which have leaked out from the channel.

In addition, it is possible to provide a second structure body having a structure similar to the first structure body 10 between the first gate electrode 5 and the first structure body 10, in the semiconductor device 101 of FIG. 5. In this case, the second structure body has a second intermediate layer which is made of a conductor and suppresses generation of charges at respective interfaces with the adjacent layers, a third layer having dielectric property between the first gate electrode and the second intermediate layer, and a fourth layer having dielectric property which is between the first gate electrode and the third layer, and has charges at a portion with the third layer. It is possible to further improve the threshold voltage of the semiconductor device 101 by providing a plurality of the structure bodies. For the reason, it is possible to control the threshold voltage of the semiconductor device 101 to an arbitrary value compared with a conventional MOSFET.

In addition, In FIG. 4A, the first semiconductor layer 1 is not necessarily required. In addition, the first insulating layer 9 is not necessarily required.

As described above, in the semiconductor device 101 of the present embodiment, the first structure body 10 is provided, and thereby a potential is generated by the charges at the interface between the first layer 7 and the second layer 8, and it is possible to control the threshold voltage to a desired value.

Hereinafter, a manufacturing method of the semiconductor device 101 will be described.

To begin with, the second semiconductor layer 2 and the first semiconductor layer 1 are laminated on a certain substrate in this order. As a forming method of these layers, a publicly known metal organic chemical vapor deposition (MOCVD: Metal Organic Chemical Vapor Deposition) method, a molecular beam epitaxy (MBE: Molecular Beam Epitaxy) method, or the like is used.

The portion shown in FIG. 4A will be described. An opening portion is previously formed in a position of the first semiconductor layer 1 and the second semiconductor layer 2 in which the first insulating layer 9 is to be formed.

Next, the first insulating layer 9 is formed on the first semiconductor layer 1 and in a position in which the intermediate layer 6 is to be formed. As a film forming method of the first insulating layer 9, a publicly known chemical vapor deposition (CVD: Chemical Vapor Deposition) method, or the like is used.

The intermediate layer 6 is formed in an opening portion of a position in which the intermediate layer 6 is to be formed. As a forming method of the intermediate layer 6, a vacuum deposition method, a sputtering method, or the like is used.

Next, the source electrode 3 and the drain electrode 4 are formed. To begin with, opening portions are formed in positions of the first semiconductor layer 1 in which the source electrode 3 and the drain electrode 4 are to be formed. Then, the source electrode 3 and the drain electrode 4 are respectively formed in the opening portions. Ti(lower)/Al/Ni/Au(upper) that is a laminated metal, for example, is used for the source electrode 3 and the drain electrode 4. After the laminated metal is formed, the laminated metal is made to come in ohmic contact by an anneal processing.

The portion shown in FIG. 5 will be described. The intermediate layer 6, the first layer 7, and the second layer 8 are laminated on the first insulating layer 9 in this order. As forming methods of these layers, a vacuum deposition method, a CVD method, a sputtering method, or the like is used.

Next, the first gate electrode 5 is formed on the second layer 8. Ni(lower)/Au(upper) is used as the laminated metal for the first gate electrode 5, for example. Pt(lower)/Au (upper) or TiN is used for the first gate electrode 5 as needed. In addition, MoN, W, WN may be used for the first gate electrode 5.

Figure 6:
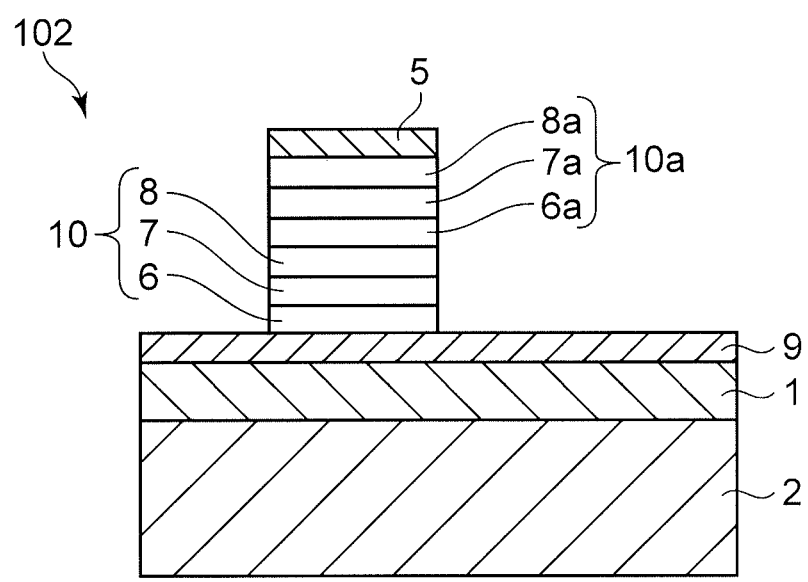
FIG. 6 is a schematic sectional view of a semiconductor device of a third embodiment.

(Third embodiment) FIG. 6 shows a semiconductor device 102.

The same symbols are given to the same portions as FIG. 5, and the description thereof will be omitted.

FIG. 6 is a schematic sectional view of the semiconductor device 102 corresponding to the position of the line B-B' of FIG. 3. In this case, a schematic sectional view of the semiconductor device 102 corresponding to the position of the line A-A' of FIG. 3 is any of FIG. 4A-FIG. 4C.

The semiconductor device 102 is configured such that in the semiconductor device 101 of FIG. 5, the second structure body 10a is inserted between the first structure body 10 and the first gate electrode 5, and the first structure body 10 and the second structure body 10a are laminated.

The second structure body 10a has a second intermediate layer 6a, a third layer 7a, and a fourth layer 8a. The second intermediate layer 6a is provided between the first gate electrode and the second layer 8. The second intermediate layer 6a electrically connects the first gate electrode 5 and the first structure body 10. The third layer 7a is provided between the first gate electrode 5 and the second intermediate layer 6a. The fourth layer 8a is provided between the first gate electrode 5 and the third layer 7a.

The intermediate layer 6 is provided across the first region 20 and the second region 30, and thereby the intermediate layer 6 uses a conductor in order to improve the conduction of carriers. But a material capable of suppressing that charges are generated at the respective interfaces with the third layer 7a and the second layer 8 is used for the second intermediate later 6a between the third layer 7a and the second layer 8.

A material of the second intermediate layer 6a is made of a conductor. The second intermediate layer 6a is made of amorphous silicon (a-Si), polysilicon (p-type polysilicon), gold (Au), platinum (Pt), tungsten (W), or the like, for example. The second intermediate layer 6a is made of a conductor having a high work function.

When the first gate electrode 5 is used as the gate electrode, the threshold voltage of the semiconductor device 102 is improved by the potentials generated in the first structure body 10 and the second structure body 10a. It is possible to further improve the threshold voltage of the semiconductor device 102 by providing a plurality of the structure bodies. For the reason, it is possible to control the threshold voltage of the semiconductor device 102 to an arbitrary value, compared with a conventional MOSFET.

In the semiconductor device 102, the first gate electrode 5, the first structure body 10, and the second structure body 10a may not be arranged in the first region 20 between the source electrode 3 and the drain electrode 4. In this case, the first gate electrode 5, the first structure body 10, and the second structure body 10a may be arranged in an arbitrary second region on the upper surface of the semiconductor device 102 distant from the first region 20.

The semiconductor device 102 has the first structure body 10 and the second structure body 10a which are to be electrically connected to the first gate electrode 5. At the interface between the first layer 7 and the second layer 8 which are included in the first structure body 10, since negative charges are generated in the first layer 7 and positive charges are generated in the second layer 8, a potential is generated between the first layer 7 and the second layer 8. In addition, at the interface between the third layer 7a and the fourth layer 8a which are included in the second structure body 10a, since negative charges are generated in the third layer 7a and positive charges are generated in the fourth layer 8a, a potential is generated between the third layer 7a and the fourth layer 8a. It is possible to improve the threshold voltage of the semiconductor device 102 by the potentials generated by these charges.

In addition, the intermediate layer 6 made of a conductor exists between the first layer 7 of the first structure body 10 and the first insulating layer 9, in the semiconductor device 102, and thereby the intermediate layer 6 does not generate charges at the respective interfaces with the first layer 7 and the first insulating layer 9 which are adjacent to the intermediate layer 6. Accordingly, the material of the first layer 7 and the material of the second layer 8 can be arbitrarily combined so that the threshold voltage of the semiconductor device 102 is improved regardless of the material of the first insulating layer 9. In addition, the second intermediate layer 6a made of a conductor exists between the third layer 7a of the second structure body 10a and the second layer 8 of the first structure body 10, and thereby the second intermediate layer 6a suppresses that charges are generated at the respective interfaces with the third layer 7a and the second layer 8 which are adjacent to the second intermediate layer 6a. Accordingly, the material of the third layer 7a and the material of the fourth layer 8a can be arbitrarily combined so that the threshold voltage of the semiconductor device 102 is improved regardless of the material of the second layer 8.

Further, it is preferable that in the semiconductor device 102, a thickness of the first insulating layer 9 is made thicker than the first structure body 10, and a material of the first insulating layer 9 is made to be a material having a larger band gap than the second semiconductor layer 2, for example. By this means, since a large energy barrier difference is generated between the first insulating layer 9 and the second semiconductor layer 2, it is possible to prevent that electrons and holes leak out from the channel formed in the second semiconductor layer 2 toward the first gate electrode 5, via the intermediate layer 6. Accordingly, it is possible to suppress that the threshold voltage of the semiconductor device 102 temporally varies by the electrons and the holes which have leaked out from the channel.

In addition, in the semiconductor device 102, the first semiconductor layer 1 is not necessarily required. In addition, the first insulating layer 9 is not necessarily required.

Figure 7:
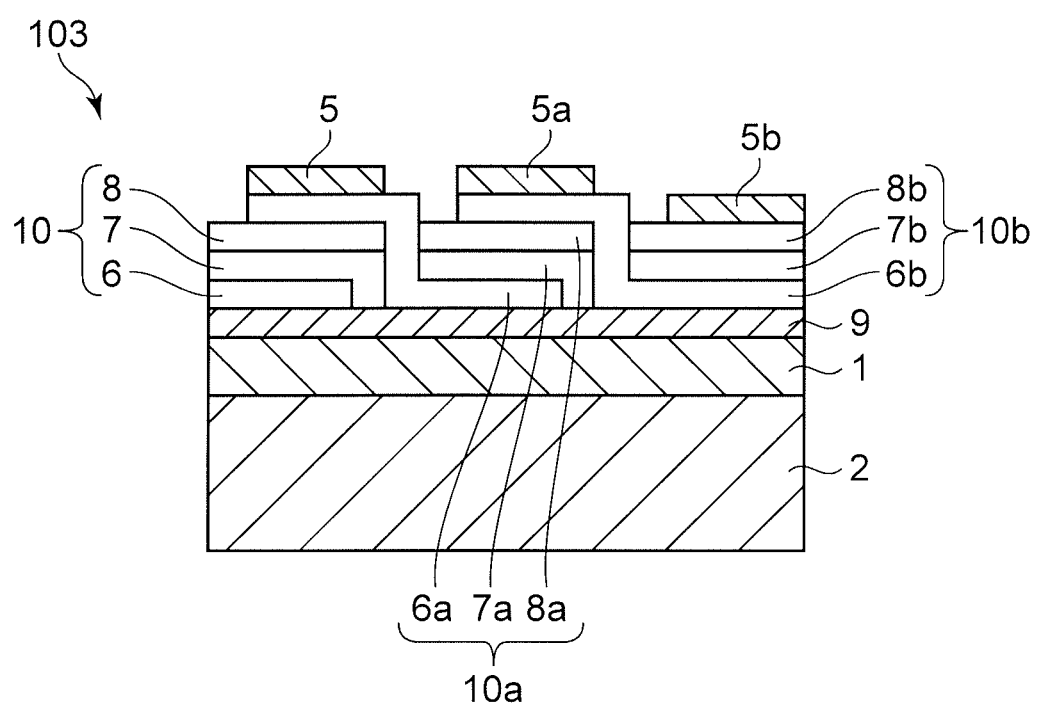
FIG. 7 is a schematic sectional view of a semiconductor device of a fourth embodiment.

(Fourth embodiment) FIG. 7 shows a semiconductor device 103.

The same symbols are given to the same portions as the semiconductor device 102 of FIG. 6, and the description thereof will be omitted.

FIG. 7 is a schematic sectional view of the semiconductor device 103 corresponding to the position of the line B-B' of FIG. 3. In this case, a schematic sectional view of the semiconductor device 103 corresponding to the position of the line A-A' of FIG. 3 is any of FIG. 4A-FIG. 4C.

The semiconductor device 103 is further provided with a second gate electrode 5a, the second structure body 10a, a third gate electrode 5b, and a third structure body 10b.

The second gate electrode 5a is in the second region distant from the first region between the source electrode 3 and the drain electrode 4. The second gate electrode 5a is provided above the first semiconductor layer 1 at a side opposite to the second semiconductor 2 side. The second gate electrode 5a is provided in the vicinity of the first gate electrode 5 and the first structure body 10. The second gate electrode 5a is a metal electrode, for example. The second gate electrode 5a is made of titanium nitride (TiN), for example.

The second structure body 10a is above the first semiconductor layer 1 at a side opposite to the second semiconductor layer 2 side. The second structure body 10a is provided between the second gate electrode 5a and the first semiconductor layer 1. The second structure body 10a is provided in the vicinity of the first structure body 10.

The second structure body 10a has the second intermediate layer 6a, the third layer 7a, and the fourth layer 8a. The second intermediate layer 6a is provided between the second gate electrode 5a and the first semiconductor layer 1. The second intermediate layer 6a is also provided between the first gate electrode 5 and the second layer 8 so as to electrically connect the first gate electrode 5 and the second structure body 10a. The third layer 7a is provided between the second gate electrode 5a and the second intermediate layer 6a. The fourth layer 8a is provided between the second gate electrode 5a and the third layer 7a.

The third gate electrode 5b is in the second region distant from the first region between the source electrode 3 and the drain electrode 4. The third gate electrode 5b is provided above the first semiconductor layer 1 at a side opposite to the second semiconductor 2 side. The third gate electrode 5b is provided in the vicinity of the first gate electrode 5, the second gate electrode 5a, the first structure body 10, and the second structure body 10a. The third gate electrode 5b is a metal electrode, for example. The third gate electrode 5b is made of titanium nitride (TiN), for example.

The third structure body 10b is above the first semiconductor layer 1 at a side opposite to the second semiconductor layer 2 side. The third structure body 10b is provided between the third gate electrode 5b and the first semiconductor layer 1. The third structure body 10b is provided in the vicinity of the first structure body 10 and the second structure body 10a.

The third structure body 10b has a third intermediate layer 6b, a fifth layer 7b, and a sixth layer 8b. The third intermediate layer 6b is provided between the third gate electrode 5b and the first semiconductor layer 1. The third intermediate layer 6b is also provided between the second gate electrode 5a and the fourth layer 8a so as to electrically connect the second gate electrode 5a and the third structure body 10b. The fifth layer 7b is provided between the third gate electrode 5b and the third intermediate layer 6b. The sixth layer 8b is provided between the third gate electrode 5b and the fifth layer 7b.

Each of the second intermediate layer 6a and the third intermediate layer 6b uses a conductor in order to improve the conduction of carriers. The second intermediate later 6a between the third layer 7a and the first insulating layer 9 uses a material which does not generate charges at the respective interfaces with the third layer 7a and the first insulating layer 9. In addition, the third intermediate later 6b between the fifth layer 7b and the first insulating layer 9 uses a material which does not generate charges at the respective interfaces with the fifth layer 7b and the first insulating layer 9.

A material of each of the second intermediate layer 6a and the third intermediate layer 6b is a conductor. The second intermediate layer 6a and the third intermediate layer 6b are each made of amorphous silicon (a-Si), polysilicon (p-type polysilicon), gold (Au), platinum (Pt), tungsten (W), or the like, for example. The second intermediate layer 6a and the third intermediate layer 6b are each made of a conductor having a high work function.

The semiconductor device 103 has the second structure body 10a and the third structure body 10b in addition to the first structure body 10, and accordingly it is possible to more improve the threshold voltage than the semiconductor device 101 provided with only the first structure body 10.

In addition, any of the first gate electrode 5, the second gate electrode 5a, and the third gate electrode 5b is used as the gate electrode in the semiconductor device 103, it is possible to arbitrarily control the threshold voltage of the semiconductor device 103.

For example, when the second gate electrode 5a out of the first gate electrode 5, the second gate electrode 5a, and the third gate electrode 5b is used as the gate electrode, the threshold voltage of the semiconductor device 103 is improved by the potentials generated in the first structure body 10 and the second structure body 10a. In this case, the potential generated in the third structure body 10b does not contribute to the threshold voltage of the semiconductor device 103.

In addition, the third gate electrode 5b out of the first gate electrode 5, the second gate electrode 5a and the third gate electrode 5b is used as the gate electrode, for example, the threshold voltage of the semiconductor device 103 is improved by the potentials generated in the first structure body 10, the second structure body 10a, and the third structure body 10b. In this case, the potentials generated in the whole of the first structure body 10, the second structure body 10a, and the third structure body 10b contribute to the threshold voltage of the semiconductor device 103.

In this manner, it is possible to provide a plurality of the structure bodies in the semiconductor device 103 in order to make the semiconductor device 103 have a desired threshold voltage. When the threshold voltage of the semiconductor device 103 is about 0 V, for example, in order to improve the threshold voltage of the semiconductor device 103 to about 1.5 V, three structure bodies each capable of improving the threshold voltage of about 0.5 V, namely, the first structure body 10, the second structure body 10a, and the third structure body 10b are provided. Accordingly, in order to make the semiconductor device 103 have the desired threshold voltage, the number of the structure bodies is determined, and the plurality of structure bodies are provided.

Though the semiconductor device 103 has a plurality of the structure bodies, since the plurality of structure bodies are arranged on the upper surface of the semiconductor device 103, a manufacturing process thereof is simple. For example, it is possible to manufacture the three intermediate layers, namely, the first, second and third intermediate layers 6, 6a, 6b on the first insulating layer 9 by one process by a CVD method. In addition, at the time of manufacturing the first, third, and fifth layers 7, 7a, 7b respectively on the first, second and third intermediate layers 6, 6a, 6b, these layers 7, 7a, 7b can be manufactured by one process. Further, at the time of laminating the second, fourth and sixth layers 8, 8a, 8b, these layers 8, 8a, 8b can similarly be manufactured by one process.

In the semiconductor device 103, since negative charges are generated in the first layer 7 and positive charges are generated in the second layer 8, at the interface between the first layer 7 and the second layer 8 which are included in the first structure body 10, a potential is generated between the first layer 7 and the second layer 8. In addition, since negative charges are generated in the third layer 7a and positive charges are generated in the fourth layer 8a, at the interface between the third layer 7a and the fourth layer 8a which are included in the second structure body 10a, a potential is generated between the third layer 7a and the fourth layer 8a. Further, since negative charges are generated in the fifth layer 7b and positive charges are generated in the sixth layer 8b, at the interface between the fifth layer 7b and the sixth layer 8b which are included in the third structure body 10b, a potential is generated between the fifth layer 7b and the sixth layer 8b. It is possible to improve the threshold voltage of the semiconductor device 103 by the potentials generated by these charges.

In addition, in the semiconductor device 103, the intermediate layer 6 made of a conductor exists between the first layer 7 of the first structure body 10 and the first insulating layer 9, and thereby the intermediate layer 6 does not generate charges at the respective interfaces with the first layer 7 and the first insulating layer 9 which are adjacent to the intermediate layer 6. Accordingly, the material of the first layer and the material of the second layer 8 can arbitrarily be combined, in order that the threshold voltage of the semiconductor device 103 is improved regardless of the material of the first insulating layer 9. The second intermediate layer 6a exists between the third layer 7a of the second structure body 10a and the first insulating layer 9, and thereby the second intermediate layer 6a does not generate charges at the respective interfaces with the third layer 7a and the first insulating layer 9 which are adjacent to the second intermediate layer 6a. Accordingly, the material of the third layer 7a and the material of the fourth layer 8a can arbitrarily be combined, in order that the threshold voltage of the semiconductor device 103 is improved regardless of the material of the first insulating layer 9. The third intermediate layer 6b exists between the fifth layer 7b of the third structure body 10b and the first insulating layer 9, and thereby the third intermediate layer 6b does not generate charges at the respective interfaces with the fifth layer 7b and the first insulating layer 9 which are adjacent to the third intermediate layer 6b. Accordingly, the material of the fifth layer 7b and the material of the sixth layer 8b can arbitrarily be combined, in order that the threshold voltage of the semiconductor device 103 is improved regardless of the material of the first insulating layer 9.

Further, in the semiconductor device 103, a thickness of the first insulating layer 9 is made thicker than each of the first, second and third structure bodies 10, 10a, 10b, and a material of the first insulating layer 9 is made to be a material having a larger band gap than the second semiconductor layer 2, for example. By this means, since a large energy barrier difference is generated between the first insulating layer 9 and the second semiconductor layer 2, it is possible to prevent that electrons and holes leak out from the channel formed in the second semiconductor layer 2 to the first, second and third gate electrodes 5, 5a, 5b via the first, second and third intermediate layer 6, 6a, 6b, respectively. Accordingly, it is possible to suppress that the threshold voltage of the semiconductor device 103 temporally varies by the electrons and the holes which have leaked out from the channel.

In addition, in the semiconductor device 103, the first semiconductor layer 1 is not necessarily required. In addition, the first insulating layer 9 is not necessarily required.

(Fifth embodiment) The present embodiment relates to an electric circuit or an electric apparatus. The electric circuit according to the present embodiment includes the semiconductor devices according to the first to fourth embodiments and modifications thereof. The electric apparatus according to the present embodiment includes the electric circuits like this. A semiconductor device 110 of the present embodiment is any of the above-described semiconductor devices 100-103.

Figure 8:
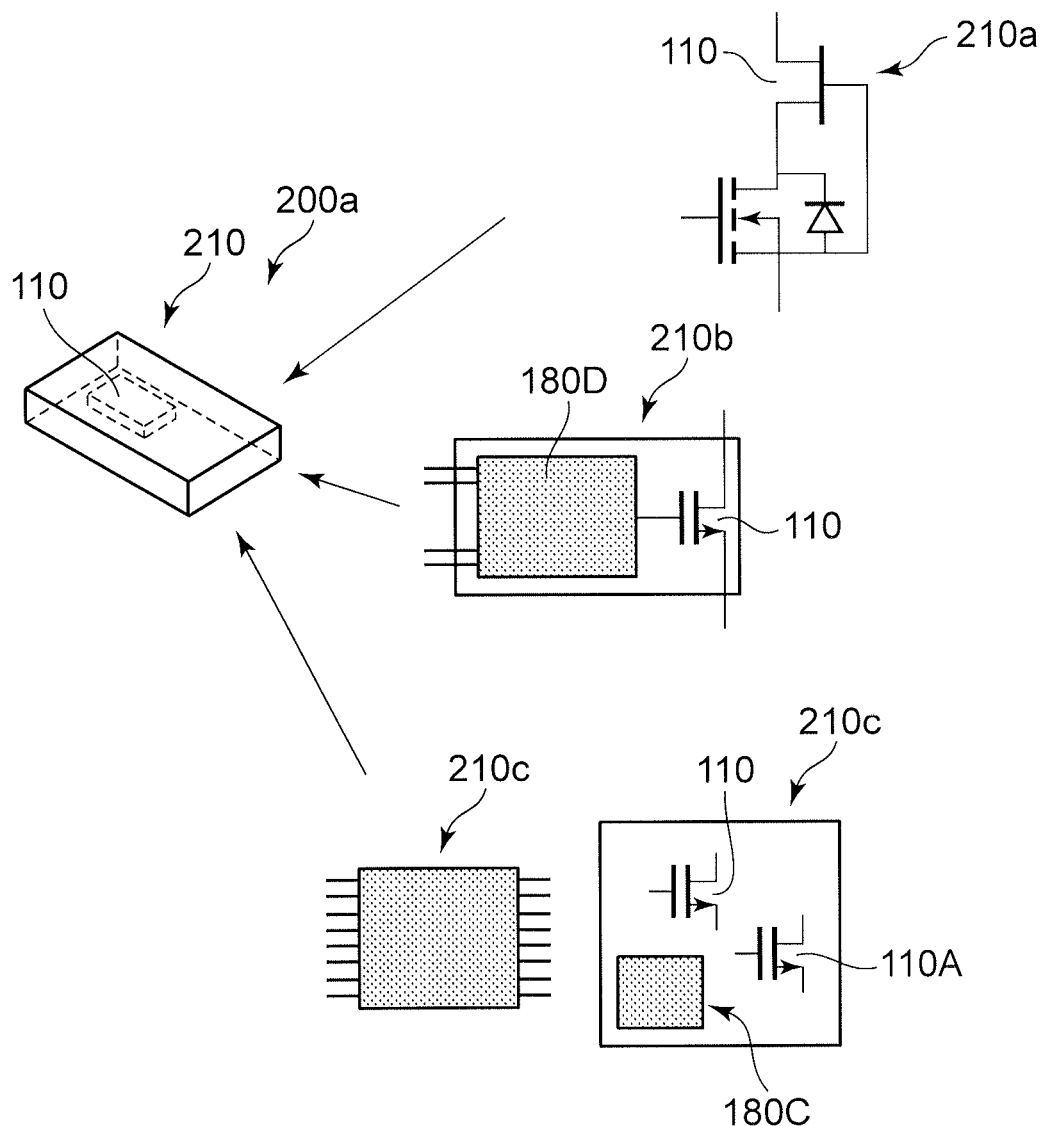
FIG. 8 is a schematic diagram exemplifying different electric circuits and electric apparatuses of a fifth embodiment.

FIG. 8 is a schematic diagram exemplifying separate electric circuits and electric apparatuses according to a fifth embodiment.

As shown in FIG. 8, an electric apparatus 200a according to the present embodiment includes an electric circuit 210. The electric circuit 210 is an IC module, for example. The electric circuit 210 includes the semiconductor device 110. For example, in an example of an electric circuit 210a, the semiconductor device 110 is cascode-connected to another semiconductor device. The electric circuit 210a is a cascode device, for example. In an example of an electric circuit 210b, for example, the semiconductor device 110 is connected to a driver circuit 180D. The electric circuit 210b is an IC, for example. In an example of an electric circuit 210c, the semiconductor device 110 and a semiconductor device 110A are used with a control circuit 180C. The electric circuit 210c is a functional IC.

Figure 9:
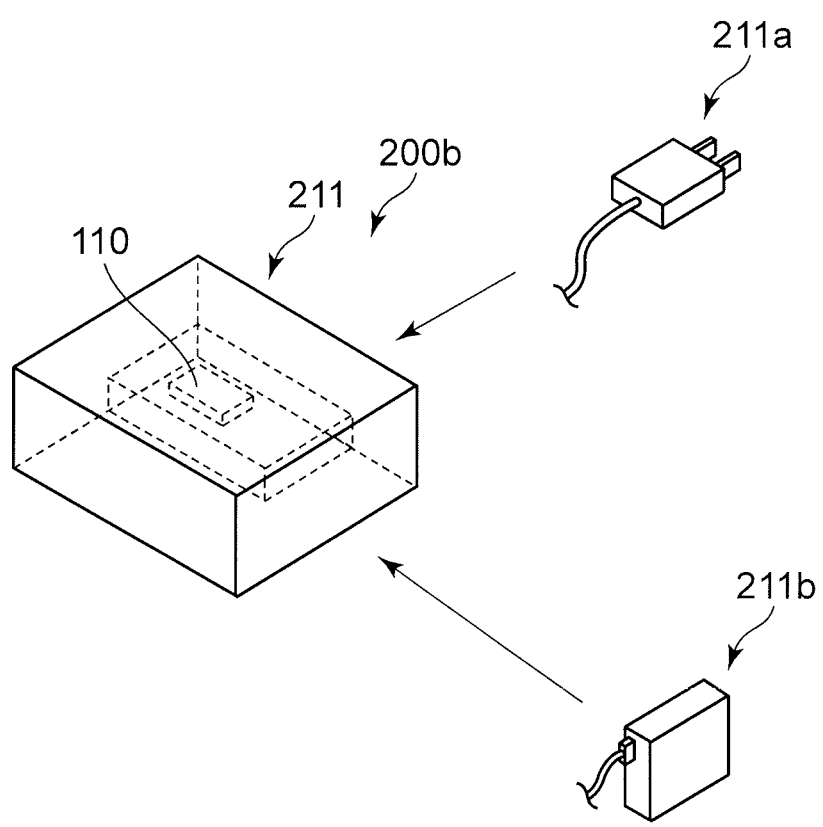
FIG. 9 is a schematic diagram exemplifying different electric circuits and electric apparatuses of the fifth embodiment.

FIG. 9 is a schematic diagram exemplifying separate electric circuits and electric apparatuses according to the fifth embodiment. As shown in FIG. 9, an electric apparatus 200b includes an electric circuit 211. The electric circuit 211 is a power source device, or a power conversion device, for example. The electric circuit 211 includes the semiconductor device 110. An electric circuit 211a is an AC adapter (a switching power source), for example. An electric circuit 211b is a DC-DC converter, an AC-DC converter, or an inverter, for example.

Figure 10:
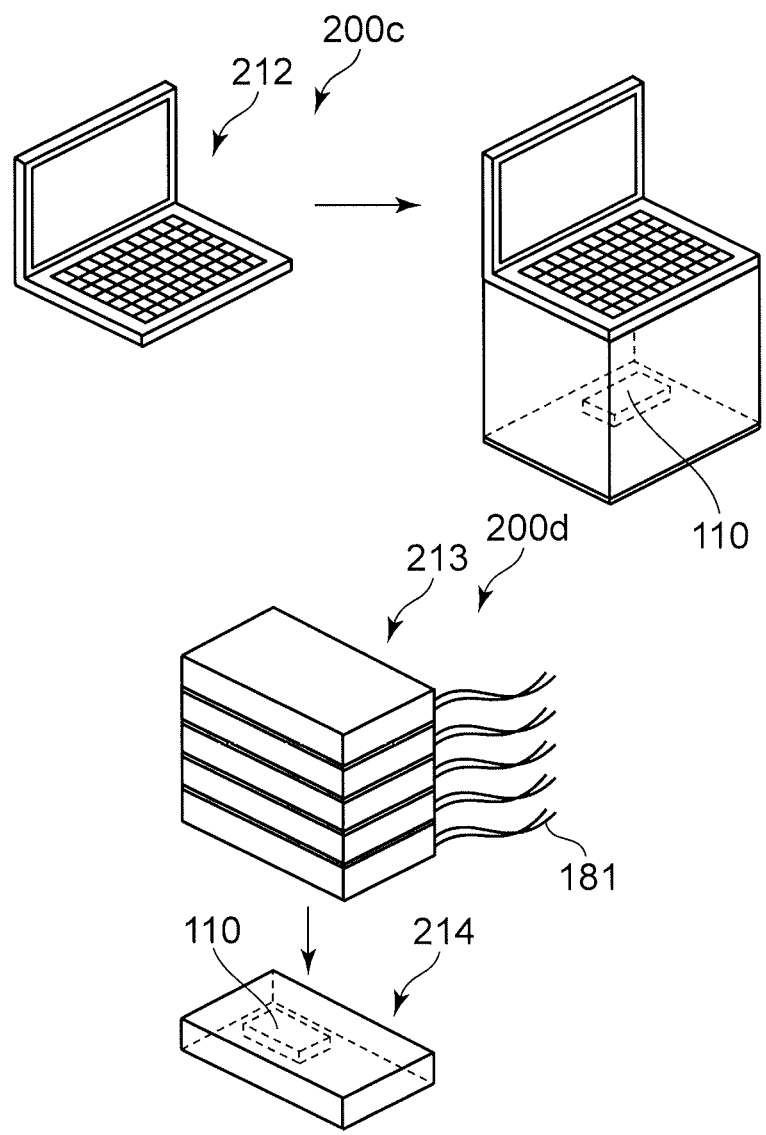
FIG. 10 is a schematic diagram exemplifying different electric circuits and electric apparatuses of the fifth embodiment.

FIG. 10 is a schematic diagram exemplifying separate electric circuits and electric apparatuses according to the fifth embodiment. As shown in FIG. 10, an electric apparatus 200c includes an electric circuit 212. The electric circuit 212 is a computer, for example. An electric apparatus 200d includes an electric circuit 213. The electric circuit 213 is a server, for example. The server is communicatable with another apparatus via a cable 181 and so on. An electric circuit 214 (a computer, for example) may be provided in the server. Each of these electric circuits 212, 213, 214 includes the semiconductor device 110.

Figure 11:
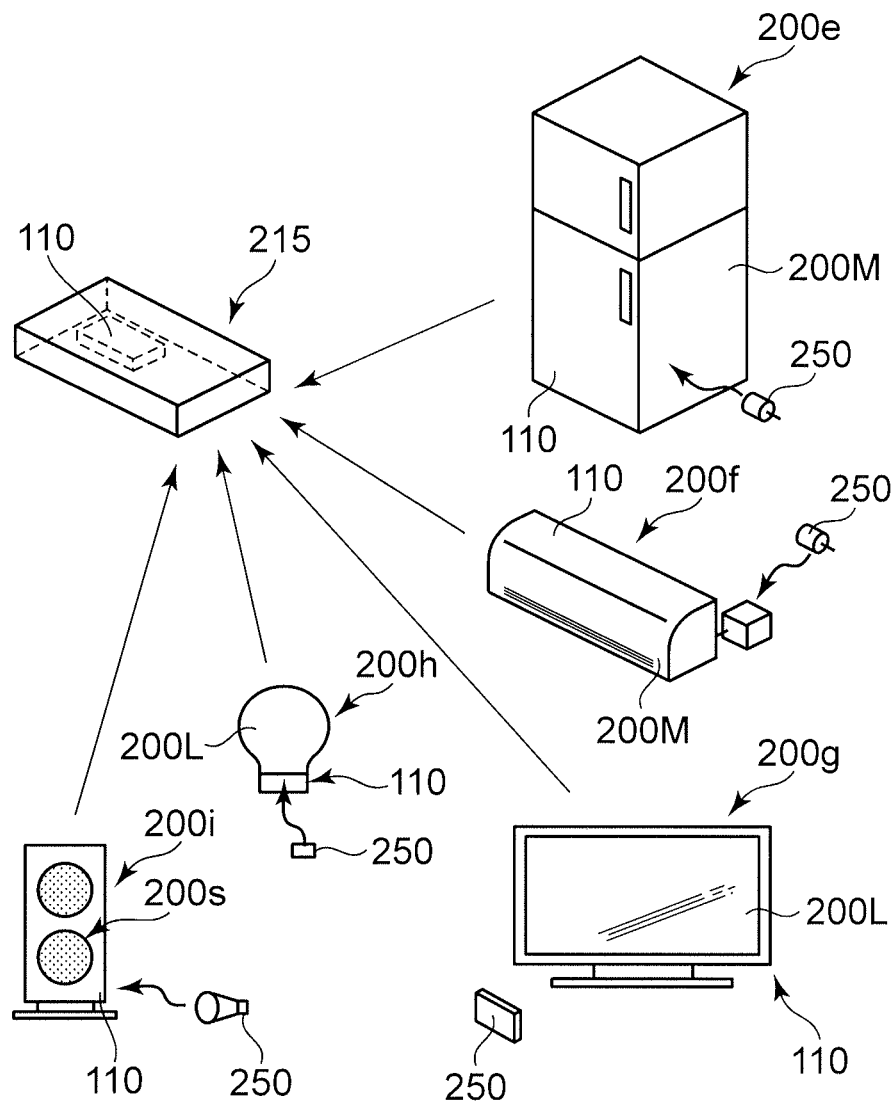
FIG. 11 is a schematic diagram exemplifying different electric circuits and electric apparatuses of the fifth embodiment.

FIG. 11 is a schematic diagram exemplifying separate electric circuits and electric apparatuses according to the fifth embodiment. As shown in FIG. 11, an electric circuit 215 is provided in each of electric apparatuses 200e-200i. The electric circuit 215 is an electronic device, for example. The semiconductor device 110 is provided in the electric circuit 215. The electric apparatus 200e is a refrigerator. The electric apparatus 200f is an air-conditioner. The electric apparatus 200g is a display device (a television set, for example). The electric apparatus 200h is a lighting device. The semiconductor device 110 is provided in a drive circuit (a light control circuit) or the like of the lighting device. The electric apparatus 200i is an acoustic device (a speaker, for example).

As described above, the electric apparatus according to the present embodiment may include various electric circuits. The electric circuit includes at least any of an electronic circuit, a power source circuit, a power conversion device, and a computer, for example. The electric circuit includes one of the semiconductor devices according to the first to fourth embodiments.

The electric circuit according to the present embodiment includes a controlled device 250 to be controlled by the semiconductor device. The controlled device 250 is a motor 200M or the like to be provided in the electric apparatus 200e (the refrigerator, for example), for example. The controlled device 250 is a motor 200M or the like to be provided in the electric apparatus 200f (the air-conditioner, for example), for example. The controlled device 250 is a light emitting portion or the like to be provided in the electric apparatus 200g (the display device, the television set, or the like), for example. The controlled device 250 is a light emitting element 200L or the like to be provided in the electric apparatus 200h (the lighting device, for example), for example. The controlled device 250 is a coil 200S or the like to be provided in the electric apparatus 200e (the acoustic device, for example), for example.

The electric apparatus according to the embodiment may include a moving device (at least any of a car, a two-wheel vehicle, an electric train, a ship, and an airplane, for example) including a motor or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a nitride semiconductor layer;
   a first gate electrode;
   a source electrode provided on the nitride semiconductor layer;
   a drain electrode provided on the nitride semiconductor layer;
   a first insulating layer provided between the nitride semiconductor layer and the first gate electrode;
   a first conductor layer provided between the first gate electrode and the first insulating layer, and suppressing generation of charges at respective interfaces with adjacent layers;
   a first dielectric layer provided between the first gate electrode and the first conductor layer; and
   a second dielectric layer provided between the first gate electrode and the first dielectric layer,
   wherein dipoles exist at an interface between the first dielectric layer and the second dielectric layer.

2. The semiconductor device according to claim 1 further comprising,
   a second conductor layer provided between the first gate electrode and the second dielectric layer, and suppressing generation of charges at respective interfaces with adjacent layers;
   a third dielectric layer provided between the first gate electrode and the second conductor layer; and
   a fourth dielectric layer provided between the first gate electrode and the third dielectric layer,
   wherein dipoles exist at an interface between the third dielectric layer and the fourth dielectric layer.

3. The semiconductor device according to claim 1 further comprising:
a second gate electrode;
a second conductor layer provided between the second gate electrode and the first insulating layer, and suppressing generation of charges at respective interfaces with adjacent layers;
a third dielectric layer provided between the second gate electrode and the second conductor layer; and
a fourth dielectric layer provided between the second gate electrode and the third dielectric layer,
wherein dipoles exist at an interface between the third dielectric layer and the fourth dielectric layer.

4. The semiconductor device according to claim 1, wherein the first conductor layer includes at least one of amorphous silicon, polysilicon, Au, Pt, and W.

5. The semiconductor device according to claim 1, wherein the first conductor layer includes a plurality of conductor materials.

6. The semiconductor device according to claim 1, wherein the first dielectric layer includes $SiO_2$, and the second dielectric layer includes $HfO_2$, $Al_2O_3$, or $TiO_2$.

7. The semiconductor device according to claim 1, wherein the second dielectric layer includes $SiO_2$, and the first dielectric layer includes $La_2O_3$, MgO or SrO.

8. The semiconductor device according to claim 1, wherein at least one of the first dielectric layer and the second dielectric layer includes ferroelectric materials.

9. The semiconductor device according to claim 1, wherein a thickness of the first insulating layer is larger than a total thickness of the first conductor layer, the first dielectric layer, and the second dielectric layer.

10. The semiconductor device according to claim 1, wherein the first insulating layer includes $SiO_2$.

11. The semiconductor device according to claim 1, wherein the first insulating layer includes a plurality of dielectric materials.

12. An electric apparatus comprising:
an electric circuit including the semiconductor device according to claim 1.

13. A semiconductor device comprising:
a nitride semiconductor layer;
a first gate electrode;
a source electrode provided on the nitride semiconductor layer;
a drain electrode provided on the nitride semiconductor layer;
a first insulating layer provided between the nitride semiconductor layer and the first gate electrode;
a first conductor layer provided between the first gate electrode and the first insulating layer, and including a conductive material having a work function of 4.8 eV or more;
a first dielectric layer provided between the first gate electrode and the first conductor layer; and
a second dielectric layer provided between the first gate electrode and the first dielectric layer,
wherein dipoles exist at an interface between the first dielectric layer and the second dielectric layer.

14. The semiconductor device according to claim 13 further comprising:
a second conductor layer provided between the first gate electrode and the second dielectric layer, and suppressing generation of charges at respective interfaces with adjacent layers;
a third dielectric layer provided between the first gate electrode and the second conductor layer; and
a fourth dielectric layer provided between the first gate electrode and the third dielectric layer,
wherein dipoles exist at an interface between the third dielectric layer and the fourth dielectric layer.

15. The semiconductor device according to claim 13 further comprising:
a second gate electrode;
a second conductor layer provided between the second gate electrode and the first insulating layer, and suppressing generation of charges at respective interfaces with adjacent layers;
a third dielectric layer provided between the second gate electrode and the second conductor layer; and
a fourth dielectric layer provided between the second gate electrode and the third dielectric layer,
wherein dipoles exist at an interface between the third dielectric layer and the fourth dielectric layer.

16. The semiconductor device according to claim 13, wherein the first conductor layer includes at least one of amorphous silicon, polysilicon, Au, and Pt.

17. The semiconductor device according to claim 13, wherein the first conductor layer includes a plurality of conductor materials.

18. The semiconductor device according to claim 13, wherein the first dielectric layer includes $SiO_2$, and the second dielectric layer includes $HfO_2$, $Al_2O_3$, or $TiO_2$.

19. The semiconductor device according to claim 13, wherein the second dielectric layer includes $SiO_2$, and the first dielectric layer includes $La_2O_3$, MgO or SrO.

20. The semiconductor device according to claim 13, wherein at least one of the first dielectric layer and the second dielectric layer includes ferroelectric materials.

21. The semiconductor device according to claim 13, wherein a thickness of the first insulating layer is larger than a total thickness of the first conductor layer, the first dielectric layer, and the second dielectric layer.

22. The semiconductor device according to claim 13, wherein the first insulating layer includes $SiO_2$.

23. The semiconductor device according to claim 13, wherein the first insulating layer includes a plurality of dielectric materials.

* * * * *